US009330979B2

(12) United States Patent
Levin et al.

(10) Patent No.: US 9,330,979 B2
(45) Date of Patent: May 3, 2016

(54) LDMOS TRANSISTOR HAVING ELEVATED FIELD OXIDE BUMPS AND METHOD OF MAKING SAME

(75) Inventors: Sharon Levin, Haifa (IL); Alexey Heiman, Migdal Haemek (IL); Zohar Shaked, Tivon (IL); Gal Fleishon, Haifa (IL)

(73) Assignee: Tower Semiconductor Ltd., Migdal Haemek, IL (US)

( * ) Notice: Subject to any disclaimer, the term of this patent is extended or adjusted under 35 U.S.C. 154(b) by 414 days.

(21) Appl. No.: 12/260,806

(22) Filed: Oct. 29, 2008

(65) Prior Publication Data

US 2010/0102388 A1   Apr. 29, 2010

(51) Int. Cl.

| H01L 21/336 | (2006.01) |
|---|---|
| H01L 21/8234 | (2006.01) |
| H01L 21/8238 | (2006.01) |
| H01L 29/423 | (2006.01) |
| H01L 29/66 | (2006.01) |
| H01L 29/78 | (2006.01) |
| H01L 21/265 | (2006.01) |
| H01L 29/08 | (2006.01) |
| H01L 29/40 | (2006.01) |

(52) U.S. Cl.
CPC ...... *H01L 21/823462* (2013.01); *H01L 21/823418* (2013.01); *H01L 21/823814* (2013.01); *H01L 21/823857* (2013.01); *H01L 29/42368* (2013.01); *H01L 29/66689* (2013.01); *H01L 29/7816* (2013.01); *H01L 21/26586* (2013.01); *H01L 29/086* (2013.01); *H01L 29/402* (2013.01)

(58) Field of Classification Search
CPC ... H01L 29/7846; H01L 21/76; H01L 21/762; H01L 21/7621; H01L 29/78; H01L 21/0223; H01L 21/02233; H01L 21/02252; H01L 21/76202; H01L 21/76205
USPC .................. 257/343, E29.256, 336, 344, 408, 257/E21.435, 374, 499–501; 438/286
See application file for complete search history.

(56) References Cited

U.S. PATENT DOCUMENTS 5,045,491 A * 9/1991 Gill et al. ...................... 438/263
6,100,556 A   8/2000 Drowley et al.
(Continued)

OTHER PUBLICATIONS

Parthasarathy et al. "A Double RESURF LDMOS With Drain Profile Engineering for Improved ESD Robustness", IEEE Electron Device Letters, vol. 23, No. 4, Apr. 2002, pp. 212-214.
(Continued)

*Primary Examiner* — Ha Tran T Nguyen
*Assistant Examiner* — Suberr Chi
(74) *Attorney, Agent, or Firm* — Bever, Hoffman & Harms, LLP

(57) ABSTRACT

A low Rdson LDMOS transistor having a shallow field oxide region that separates a gate electrode of the transistor from a drain diffusion region of the transistor. The shallow field oxide region is formed separate from the field isolation regions (e.g., STI regions) used to isolate circuit elements on the substrate. Fabrication of the shallow field oxide region is controlled such that this region extends below the upper surface of the semiconductor substrate to a depth that is much shallower than the depth of field isolation regions. For example, the shallow field oxide region may extend below the upper surface of the substrate by only Angstroms or less. As a result, the current path through the resulting LDMOS transistor is substantially unimpeded by the shallow field oxide region, resulting in a low on-resistance.

17 Claims, 16 Drawing Sheets

(56) References Cited

U.S. PATENT DOCUMENTS

| | | |
|---|---|---|
| 6,211,552 B1 | 4/2001 | Efland |
| 6,242,787 B1 | 6/2001 | Nakayama |
| 6,468,870 B1* | 10/2002 | Kao et al. ............... 438/297 |
| 6,483,149 B1 | 11/2002 | Mosher et al. |
| 6,693,339 B1 | 2/2004 | Khemka et al. |
| 6,800,528 B2 | 10/2004 | Sasaki |
| 6,818,494 B1 | 11/2004 | Chen et al. |
| 6,882,023 B2 | 4/2005 | Khemka et al. |
| 6,900,101 B2* | 5/2005 | Lin ............... 438/276 |
| 7,575,977 B2 | 8/2009 | Levin et al. |
| 2003/0173624 A1 | 9/2003 | Choi et al. |
| 2004/0041265 A1* | 3/2004 | Gonzalez et al. ............ 257/758 |
| 2005/0112822 A1 | 5/2005 | Litwin |
| 2005/0148114 A1 | 7/2005 | Rhodes |
| 2006/0006489 A1 | 1/2006 | Park |
| 2006/0124999 A1* | 6/2006 | Pendharkar ............ 257/335 |
| 2008/0073746 A1* | 3/2008 | Tanaka ............ 257/510 |
| 2010/0102386 A1* | 4/2010 | You ............ 257/336 |
| 2010/0102388 A1 | 4/2010 | Levin et al. |
| 2011/0272758 A1 | 11/2011 | Banerjee et al. |
| 2014/0070315 A1 | 3/2014 | Levy et al. |

OTHER PUBLICATIONS

Bengtsson et al. "Small-Signal and Power Evaluation of Novel BiCMOS-Compatible Short-Channel LDMOS Technology," IEEE Transactions on Microwave Theory and Techniques, vol. 51, No. 3, Mar. 2003, pp. 1052-1056.

Itonaga et al. "A High-Performance and Low-Noise CMOS Image Sensor with an Expanding Photodiode under the Isolation Oxide," Electron Devices Meeting, 2005, IEDM Technical Digest, IEEE International, Dec. 5-7, 2005, 4 pgs.

\* cited by examiner

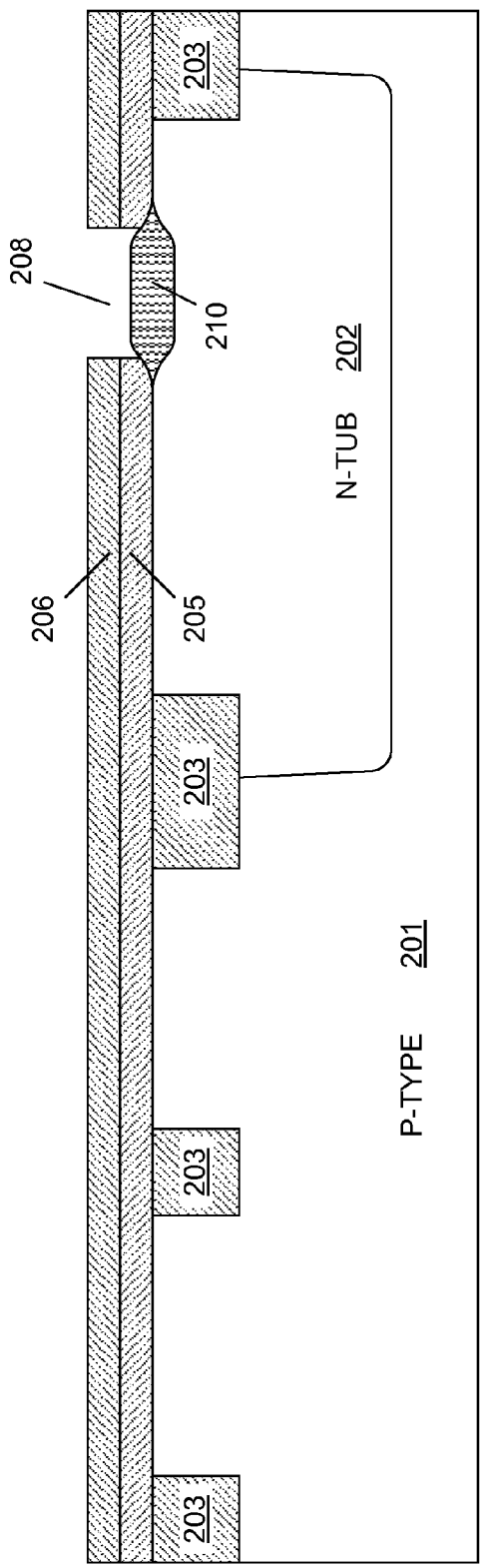
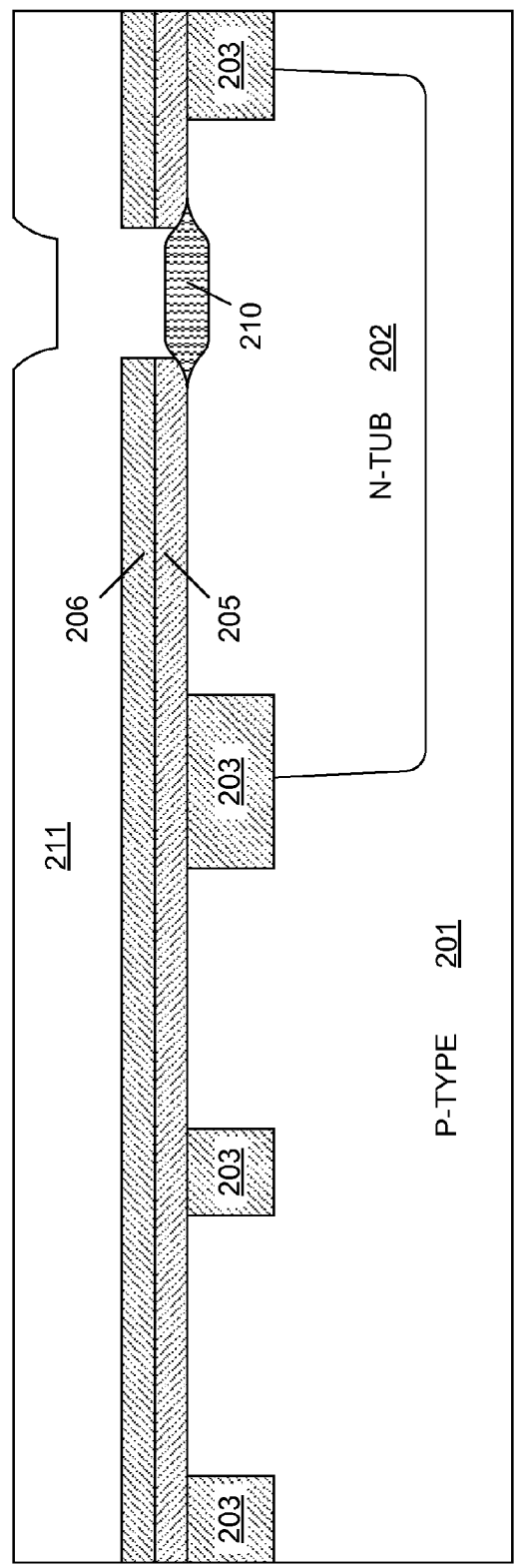
FIG. 3E
FIG. 3F

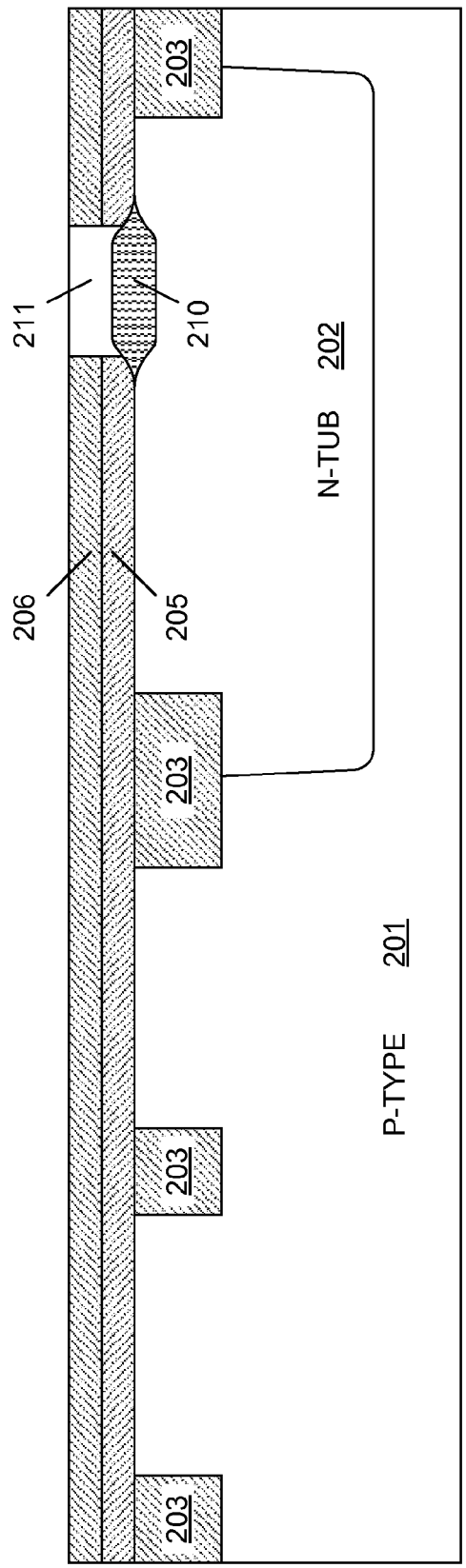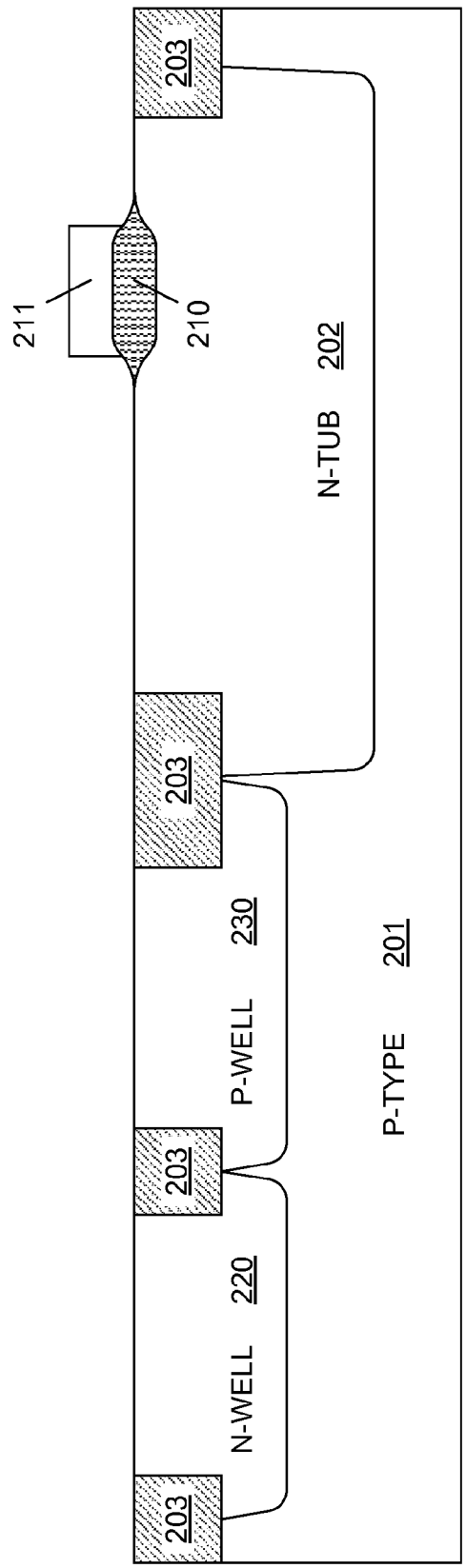
FIG. 3G
FIG. 3H

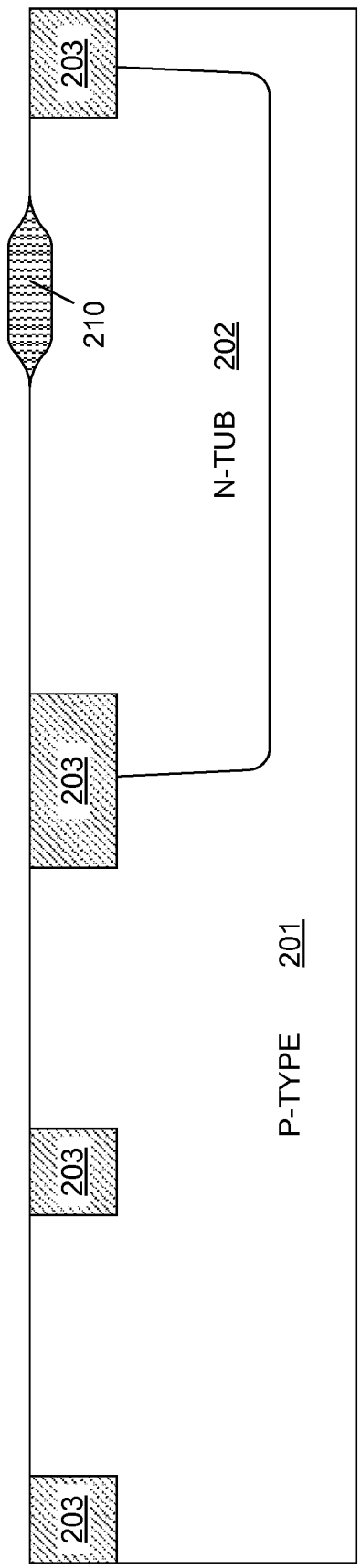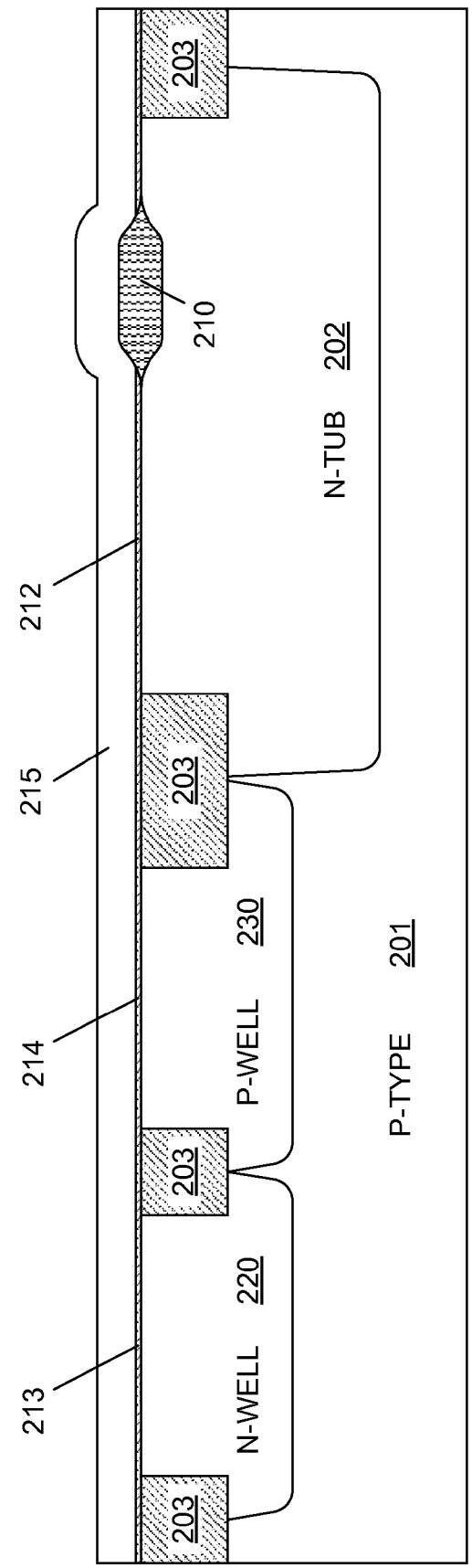
FIG. 5A
FIG. 5B

LDMOS TRANSISTOR HAVING ELEVATED FIELD OXIDE BUMPS AND METHOD OF MAKING SAME

RELATED APPLICATION

The present application is related to commonly owned U.S. patent application Ser. No. 11/691,459, filed Mar. 26, 2007 and entitled "Self-Aligned LDMOS Fabrication Method Integrated Deep-Sub-Micron VLSI Process, Using A Self-Aligned Lithography Etches And Implant Process".

BACKGROUND OF THE INVENTION

1. Field of the Invention

The present invention relates to a lateral diffused MOSFET (LDMOS) transistor having an elevated gate dielectric structure, which significantly reduces on-resistance ($R_{DSON}$) while increasing the breakdown voltage and improving the device robustness to hot carrier degradation. The device can be easily integrated with conventional deep sub-micron VLSI processes.

2. Related Art

FIG. 1A is a cross sectional view of a conventional LDMOS transistor 100, which includes P+ substrate 101, P– epitaxial layer 102, deep p-well region 103, P+ backgate contact 104, N+ source region 105, N type reduced surface field region 106, N+ drain contact region 107, gate oxide layer 108, field oxide regions 109-110 and gate electrode 111.

Field oxide regions 109 and 110 are formed simultaneously by conventional local oxidation of silicon (LOCOS) or poly-buffered LOCOS (PBL). Field oxide region 110 provides electrical isolation between LDMOS transistor 100 and other devices (not shown) fabricated in the same substrate. Field oxide region 110 must be relatively thick to provide such isolation. For example, field oxide region 110 typically has a thickness of about 5000 Angstroms or more (depending on the technology node). Because field oxide regions 109 and 110 are thermally grown, half of these oxide regions are grown underneath the silicon surface. Thus, field oxide regions 109 and 110 extend into the silicon surface to a depth of about 2500 Angstroms or more.

Because they are fabricated at the same time, field oxide regions 109 and 110 have the same thickness. Field oxide region 109 is thick enough to protect gate oxide layer 108 from high electric fields that result from voltages applied to drain contact region 107. That is, the field oxide region 109 is sufficiently thick under polysilicon gate electrode 111 where the diffusion region 106 extends between the channel edge and the drain contact region 107. LDMOS transistor 100 is described in more detail in U.S. Pat. No. 6,483,149 to Mosher et al.

In high voltage and power applications, it is desirable to minimize the on-resistance $R_{DSON}$ of LDMOS transistor 100, such that the switch area and power dissipation associated with this transistor 100 is minimized. However, current flowing through LDMOS transistor 100 is forced to bypass the field oxide region 109, thereby resulting in a relatively high on-resistance. That is, the current flowing through LDMOS transistor 100 must flow deep within the silicon, along the relatively long path that exists under field oxide region 109.

FIG. 1B is a cross sectional view of another conventional LDMOS transistor 120, wherein field oxide regions 109 and 110 are replaced by shallow trench isolation (STI) regions 129-130, and polysilicon gate electrode 111 is replaced by polysilicon gate electrode 131. STI regions 129 and 130 are formed simultaneously by conventional methods (i.e., etching trenches in the substrate, and then filling the trenches with dielectric material). STI region 130 provides electrical isolation between LDMOS transistor 120 and other devices (not shown) fabricated in the same substrate. In general, STI region 130 extends deeper below the surface of the substrate in comparison to field oxide region 110, as trench isolation is almost completely below the silicon surface. Thus, in the described example, STI region 130 usually has a depth of about 3500 Angstroms.

Because they are fabricated at the same time, STI regions 129 and 130 have the same depth (e.g., 3500 Angstroms). The large depth of STI region 129 causes LDMOS transistor 120 to exhibit higher on-resistance than LDMOS transistor 100. In addition, the sharp corners typical of STI region 129 (compared to the smooth profile at the LOCOS bird's beak region) locally increases the electric field at those corners, which results in rapid hot carrier degradation and lower breakdown voltage within LDMOS transistor 120.

It would therefore be desirable to have an improved LDMOS transistor that exhibits an on-resistance less than conventional LDMOS transistors. It would further be desirable for such an LDMOS transistor have a compact layout area. It would also be desirable to be able to easily integrate the fabrication of such an LDMOS transistor with conventional deep sub-micron VLSI processes.

SUMMARY

Accordingly, the present invention provides an LDMOS transistor having an elevated thick gate dielectric region that does not extend substantially beneath the surface of the semiconductor substrate on which the transistor is fabricated. This LDMOS transistor is fabricated by forming a hard mask having an opening that exposes the substrate region where the thick gate dielectric region is to be formed, and then performing a thermal oxidation step through the opening of this mask, thereby forming a shallow field oxide region. This shallow field oxide region extends below the upper surface of the semiconductor substrate to a depth that is much shallower than the depth of field isolation regions used to isolate the various structures fabricated on the substrate. For example, the shallow field oxide region may extend below the upper surface of the substrate by only 250 Angstroms or less. As a result, the current path through the resulting LDMOS transistor is substantially unimpeded by the shallow field oxide region.

After the shallow field oxide region has been formed, a layer of gate dielectric material may be deposited over the resulting structure, wherein the gate dielectric material covers the hard mask and fills the opening of the hard mask. A chemical mechanical polishing step is then performed to remove the gate dielectric material located over the hard mask. The CMP step is stopped on the upper surface of the hard mask, thereby leaving a gate dielectric region on top of the shallow field oxide region (within the opening of the hard mask). The hard mask is removed and the remainder of the LDMOS transistor is fabricated using conventional CMOS processing steps. The thickness of the gate dielectric region is effectively selected by controlling the height of the hard mask.

The shallow field oxide region and the overlying gate dielectric region combine to form an elevated thick dielectric region, which exists substantially above the upper surface of the semiconductor substrate. The resulting LDMOS transistor exhibits a low on-resistance, along with breakdown and threshold voltages comparable or better than a conventional LDMOS transistor.

The present invention will be more fully understood in view of the following description and drawings.

BRIEF DESCRIPTION OF THE DRAWINGS

FIGS. 3A-3L are cross sectional views of an LDMOS transistor, a low voltage PMOS transistor and a low voltage NMOS transistor during various stages of fabrication, in accordance with one embodiment of the present invention.

FIGS. 5A-5E are cross sectional views of an LDMOS transistor, a low voltage PMOS transistor and a low voltage NMOS transistor during various stages of fabrication, in accordance with an alternate embodiment of the present invention.

DETAILED DESCRIPTION

Figure 2:
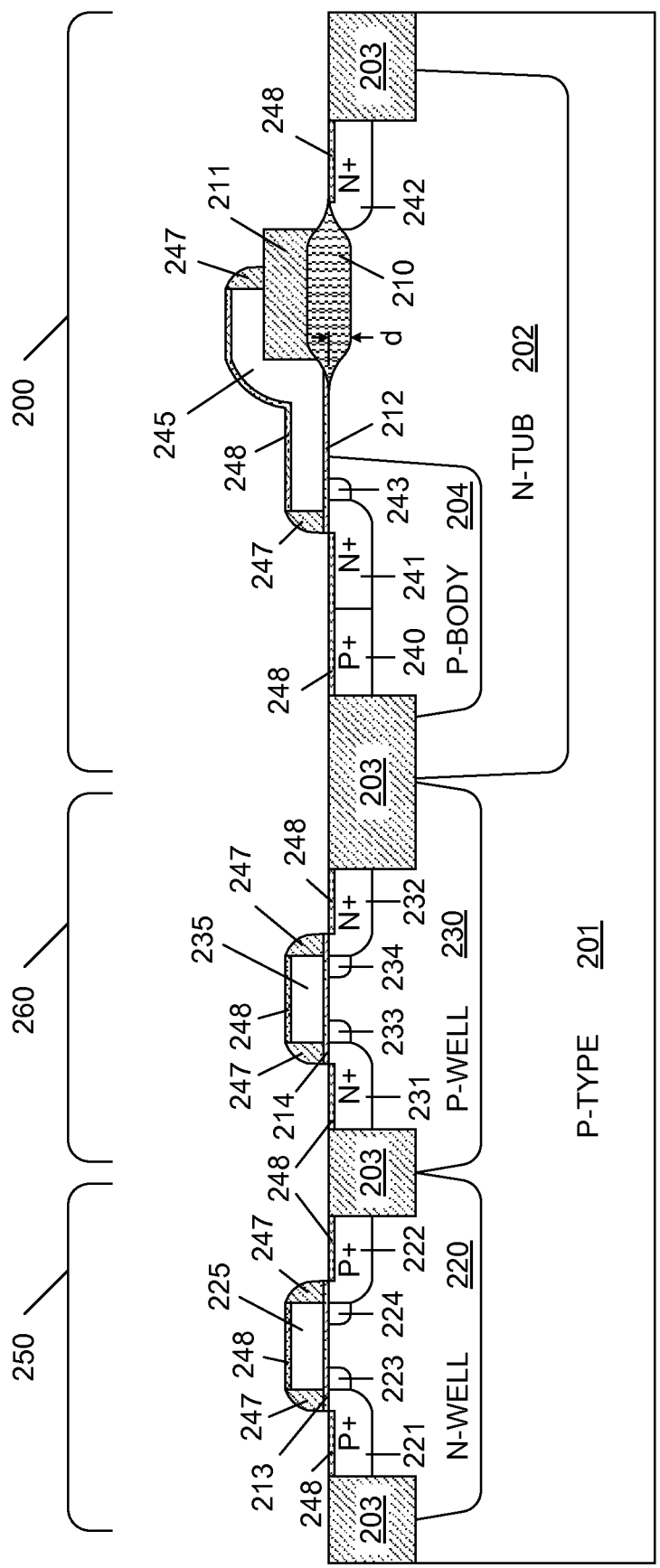
FIG. 2 is a cross-sectional view of an LDMOS transistor in accordance with one embodiment of the present invention.

FIG. 2 is a cross-sectional view of an LDMOS transistor 200 in accordance with one embodiment of the present invention. FIG. 2 also includes cross-sectional views of low voltage MOS transistors 250 and 260, which are fabricated on the same substrate as LDMOS transistor 200. As described in more detail below, the structure of FIG. 2 can be fabricated using a process that is compatible with a conventional deep sub-micron VLSI (CMOS) process. Transistors 200, 250 and 260 (and other circuit elements fabricated on the same substrate) are isolated by field isolation regions 203. In the illustrated embodiments, field isolation regions 203 are shallow trench isolation (STI) regions that extend below the surface of substrate 201 to a depth of about 3500 Angstroms. In alternate embodiments, field isolation regions 203 may be fabricated by LOCOS or PBL techniques, such that these field isolation regions have a birds beak profile and a depth of about 2500 Angstroms.

LDMOS transistor 200 is fabricated in n-type tub region 202, which in turn, is fabricated in p-type region 201. LDMOS transistor 200 includes p-type body region 204, shallow field oxide region 210, stacked dielectric region 211, P+ body contact region 240, N+ source contact region 241, N+ drain contact region 242, N− source extension region 243, gate dielectric layer 212, gate electrode 245, dielectric sidewall spacers 247 and metal salicide regions 248. Shallow field oxide region 210 only extends a shallow depth (d) below the upper surface of n-type tub region 202. The shallow depth d is significantly less than the depth of field isolation regions 203. Stated another way, the shallow depth d is significantly less than the depths of isolation regions 109 and 129 used by conventional LDMOS transistors 100 and 120. In one embodiment, the depth d is less than or equal to about 250 Angstroms.

The relatively shallow depth d of field oxide region 210 provides for a relatively direct current path between the source contact region 241 and the drain contact region 242 through N-tub region 202. That is, field oxide region 210 does not require current to be routed deep within the N-tub region 210 in order to flow through drain contact region 242. As a result, the on-resistance $R_{DSON}$ of LDMOS transistor 200 is significantly lower than the on-resistance of a conventional LDMOS transistor. In the described embodiment, the on-resistance of LDMOS transistor 200 is reduced by approximately 30% compared with a conventional LDMOS transistor with STI regions, while the robustness to hot carrier degradation & "on"-state breakdown due to snapback are significantly improved as well.

Stacked dielectric layer 211 is positioned on top of shallow field oxide region 210, in order to provide the required isolation between the right-most portions of gate electrode 245 and the underlying drift region within N-tub region 202 (and drain contact region 242). As described in more detail below, the thickness and/or material of stacked dielectric layer 211 can be precisely controlled to provide the required isolation for LDMOS transistor 200. Because the gate isolation may be increased by increasing the vertical height of stacked dielectric region 211, it is possible to increase the gate isolation without increasing the layout area of LDMOS transistor 200. Consequently, the layout area of LDMOS transistor 200 may advantageously be minimized. In addition, the LDMOS transistor 200 of the described embodiment advantageously exhibits a similar or higher breakdown voltage (BVdss) and a similar threshold voltage ($V_{TH}$) as a conventional LDMOS transistor.

The fabrication of LDMOS transistor 200 in accordance with one embodiment of the present invention will now be described. Low voltage CMOS transistors 250 and 260 are fabricated concurrently with LDMOS transistor 200 in the manner described below.

FIGS. 3A-3L are cross sectional views of LDMOS transistor 200, PMOS transistor 250 and NMOS transistor 260 during various stages of fabrication, in accordance with one embodiment of the present invention.

Figure 3A:
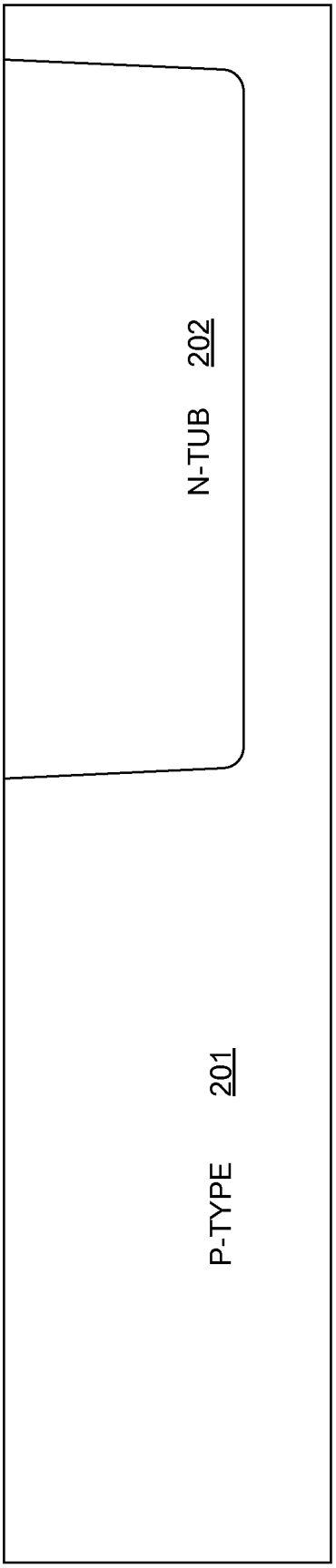

As illustrated in FIG. 3A, LDMOS transistor 200, PMOS transistor 250 and NMOS transistor 260 are fabricated in a p-type semiconductor region 201. P-type semiconductor region 201 can be, for example, a p-type monocrystalline silicon substrate. P-type semiconductor region 201 may alternately be an epitaxially grown p-type silicon layer or a p-type silicon-on-insulator (SOI) region. An N-type tub (deep well) region 202 is formed in p-type semiconductor region 201 by conventional CMOS processing steps, which include: forming an implant mask, implanting an n-type impurity through an opening in the mask, and thermally diffusing the n-type impurity. As will become apparent in view of the following description, N-tub region 202 forms the drain of LDMOS transistor 200.

Figure 3B:
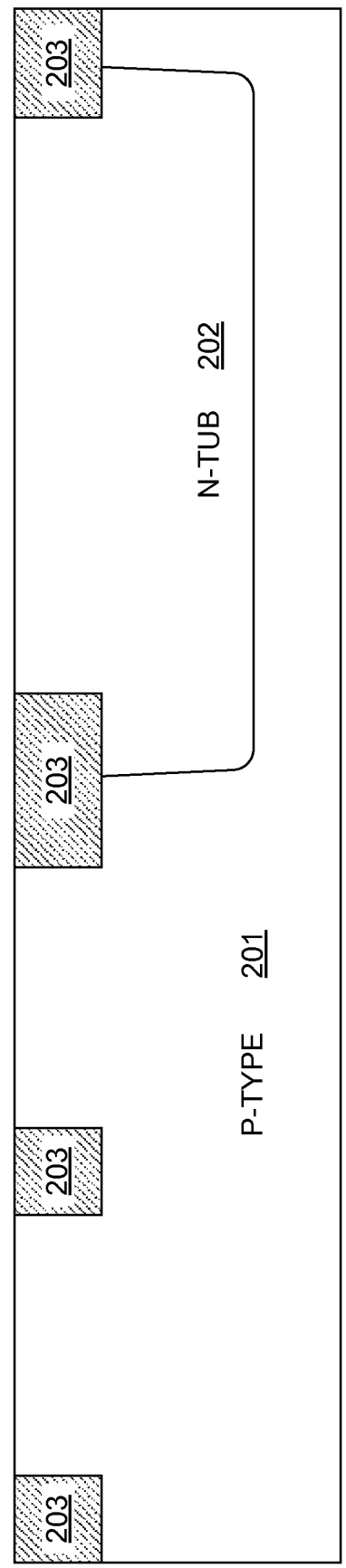

As shown in FIG. 3B, field isolation regions 203 are then fabricated at the upper surface of the resulting semiconductor structure. In the illustrated example, field isolation regions 203 are shallow trench isolation (STI) regions, which are formed using conventional CMOS processing steps. In the described example, STI regions 203 have a depth of about 3500 Angstroms, although other depths are possible. In alternate embodiments, field isolation regions 203 can be formed by conventional LOCOS or poly-buffered LOCOS (PBLOCOS) processes.

Figure 3C:
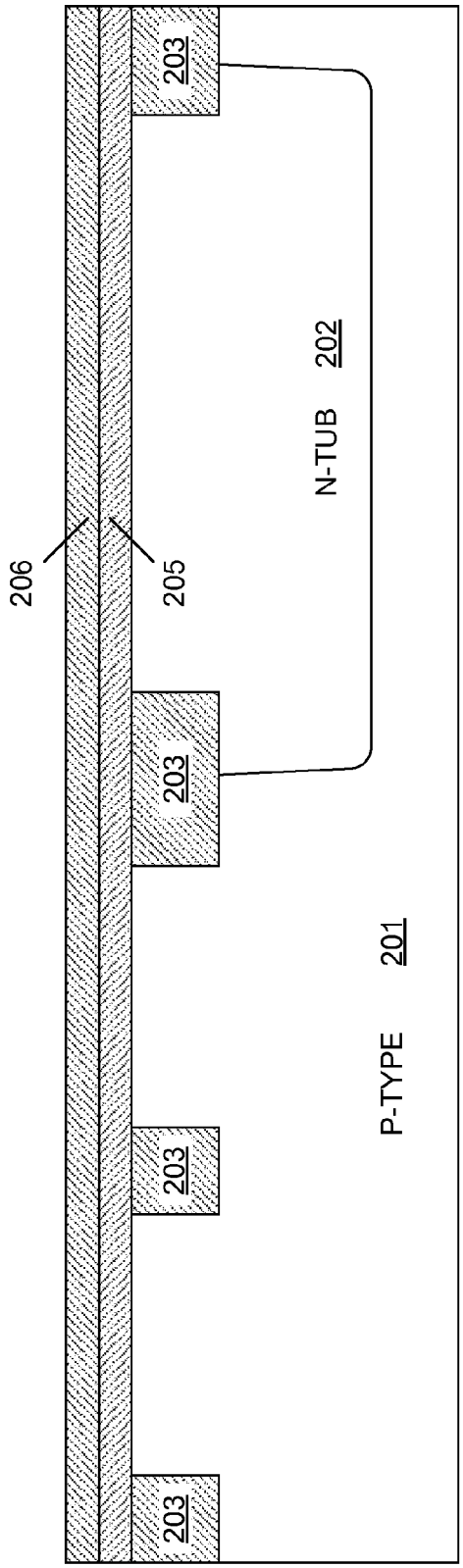

As illustrated in FIG. 3C, a silicon oxide ($SiO_2$) screening layer 205 is thermally grown over the upper surface of the semiconductor structure of FIG. 3B. A sacrificial silicon nitride ($SiN_4$) layer 206 is then deposited over silicon oxide layer 205 using a standard chemical vapor deposition (CVD) process. The combined thickness of silicon oxide layer 205 and silicon nitride layer 206 is selected to correspond with the desired gate dielectric thickness adjacent to drain contact region 242 (FIG. 2). In the described embodiment, silicon oxide layer 205 has a thickness of about 80 Angstroms and silicon nitride layer 206 has a thickness in the range of about 500 to 2000 Angstroms.

Figure 3D:
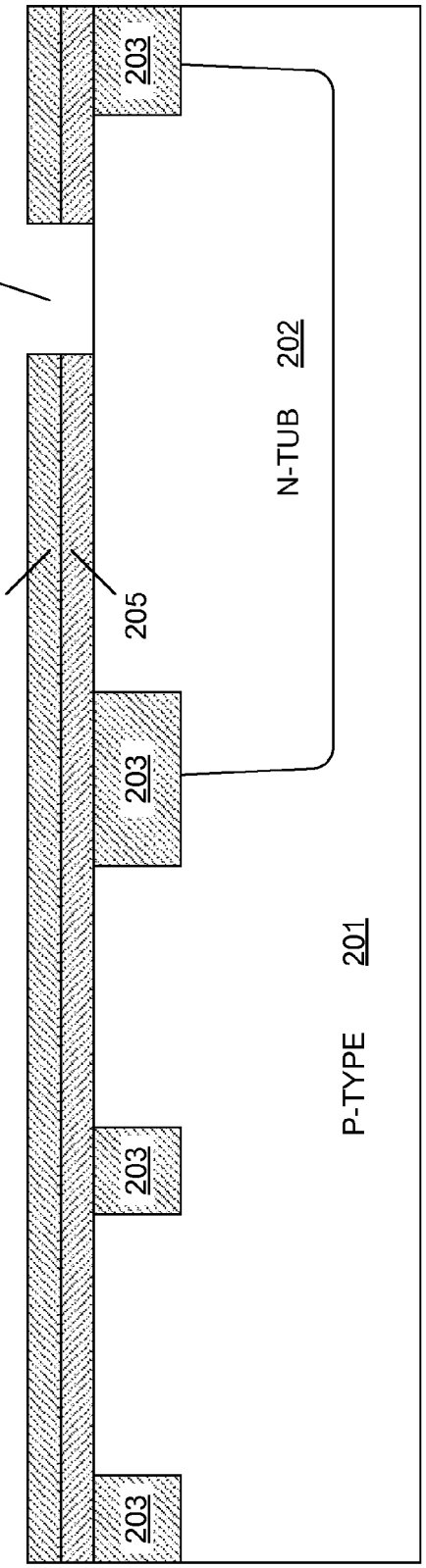

As shown in FIG. 3D, an opening 208 is formed through silicon oxide layer 205 and silicon nitride layer 206. This opening 208 is created by: forming a photoresist mask (not shown) over silicon nitride sacrificial layer 206, wherein the photoresist mask has an opening which exposes the region where opening 208 is subsequently formed; performing a dry etch through the opening in the photoresist mask, thereby creating opening 208, and then removing the photoresist mask. The location of opening 208 is selected to correspond with the desired location of shallow field oxide region 210 and stacked dielectric region 211 (FIG. 2).

As illustrated in FIG. 3E, a thermal oxidation step is performed to form a thin LOCOS isolation layer 210 on the portion of N-tub 202 exposed through opening 208. In the described embodiment, thin isolation layer 210 has a total thickness of about 500 Angstroms. Thus, thin isolation layer 210 extends about 250 Angstroms above and below the upper surface level of N-tub region 202. In one embodiment of the present invention, thin isolation layer 210 has a thickness in the range of about 200 to 500 Angstroms. In other embodiments, the thermal oxidation step is controlled, such that the thin isolation layer 210 has other thicknesses. In a particular embodiment, thin isolation layer 210 has a thickness less than 500 Angstroms, such that this layer 210 does not adversely effect the shape of the resulting dielectric structure. It is important to note that the thin isolation layer 210 has thickness that is substantially less than the thickness of STI regions 203. In accordance with one embodiment, the thin isolation layer 210 has a thickness at least about ten times less than a thickness of STI regions 203. It is also important to note that the thin isolation layer 210 exhibits a curved bird's beak profile, rather than the sharp edges of STI regions 203.

As shown in FIG. 3F, a dielectric layer 211 is deposited over sacrificial silicon nitride layer and thin isolation layer 210. In one embodiment, dielectric layer 211 is formed by the chemical vapor deposition (CVD) of silicon oxide. The thickness of dielectric layer 211 is controlled to be sufficient to completely fill opening 208.

As illustrated in FIG. 3G, a chemical-mechanical polishing (CMP) step is performed to remove the portion of dielectric layer 211 that extends above sacrificial silicon nitride layer 206. The CMP step is stopped on sacrificial silicon nitride layer 206, by a self aligned CMP process resulting in precise control of the thickness of the dielectric bump formed by thin isolation region 210 and gate dielectric region 211. At the end of the CMP step, the only remaining portion of dielectric layer 211 exists within opening 208. Thus, the combined thickness of thin isolation region 210 and gate dielectric region 211 above the upper surface of N-tub region 202 is defined by the thickness of silicon oxide layer 205 and sacrificial silicon nitride layer 206. In the described embodiment, the combined thickness of thin isolation region 210 and gate dielectric region 211 can be in the range of about 700 to 2000 Angstroms.

As shown in FIG. 3H, silicon nitride layer 206 is removed by performing an etch with hot phosphoric acid. This etch is highly selective to silicon oxide, and does not remove thin isolation region 210 or gate dielectric region 211. N-well region 220 and P-well region 230 are then formed by conventional CMOS processing steps (i.e., mask formation, well implant, mask removal). Silicon oxide layer 205 is then removed by a conventional etch in diluted HF or in buffered HF before gate dielectric deposition. Etch time is chosen according to the thickness of screening oxide 205. Note that the exposed upper surface of gate dielectric region 211 is partially removed during this etch, such that the thickness of gate dielectric region 211 is reduced. However, the controlled nature of the etch allows the final thickness of gate dielectric region 211 to be precisely controlled.

Figure 3I:
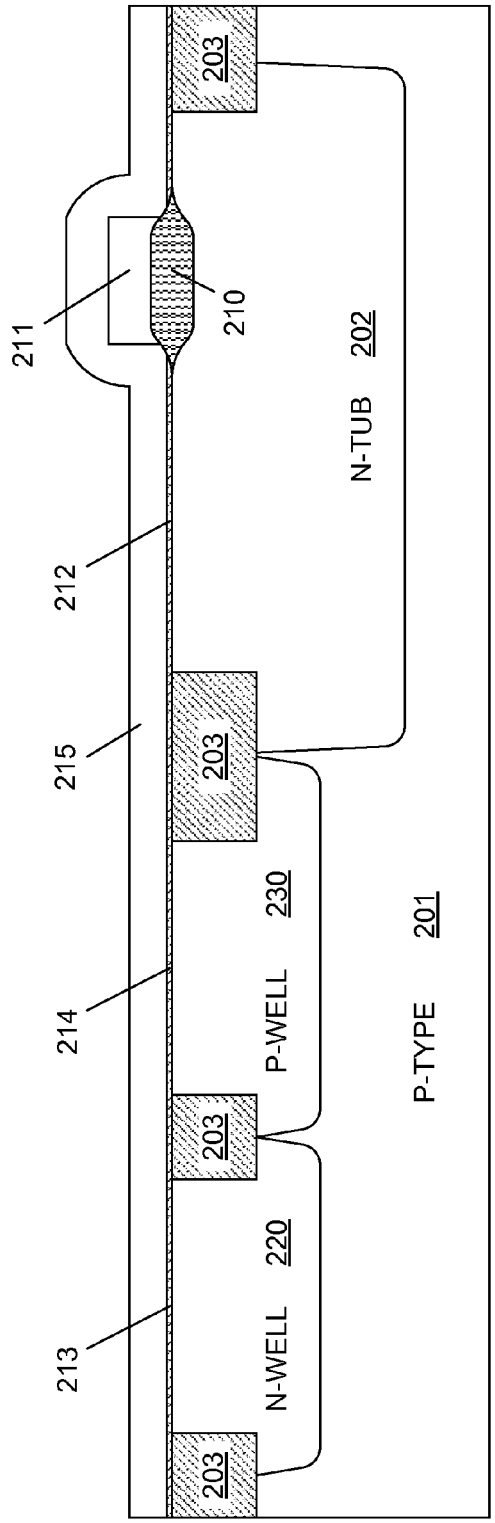

As illustrated in FIG. 3I, gate dielectric layers 212, 213 and 214 are formed over the upper surfaces of N-tub region 202, N-well region 220 and P-well region 230, respectively. In the described embodiment, gate dielectric layer 212 is thicker than gate dielectric layers 213 and 214, thereby enabling LDMOS transistor 202 to operate in response to relatively high voltages. For example, gate dielectric layer 212 may include 210 Angstroms of thermally grown silicon oxide, while gate dielectric layers 213 and 214 may include 30 Angstroms of thermally grown silicon oxide. Gate dielectric layers 212-214 may be formed by a combination of oxidation, deposition and selective dielectric etch steps, which are commonly known to those of ordinary skill in the art. A conductively doped polysilicon layer 215, which will eventually form gate electrodes 225, 235 and 245, is formed over gate dielectric layers 212-214.

Figure 3J:
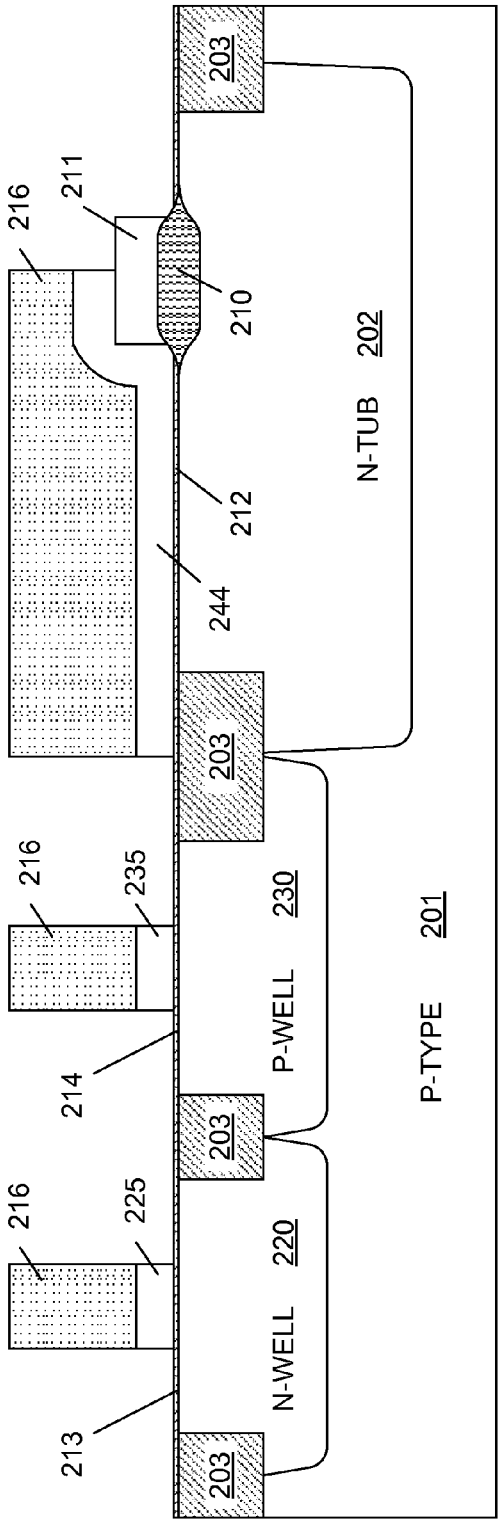

As shown in FIG. 3J, a first gate line photoresist mask 216 is formed over polysilicon layer 215, and an etch is performed through the openings of this gate line mask. This etch defines the gate electrode 225 of PMOS transistor 250 and the gate electrode 235 of NMOS transistor 260. In addition, this etch removes the portion of polysilicon layer 215 located over the drain side of LDMOS transistor 200. Note that gate line mask 216 covers the source side of LDMOS transistor 200, such that polysilicon region 244 remains over the source side.

Figure 3K:
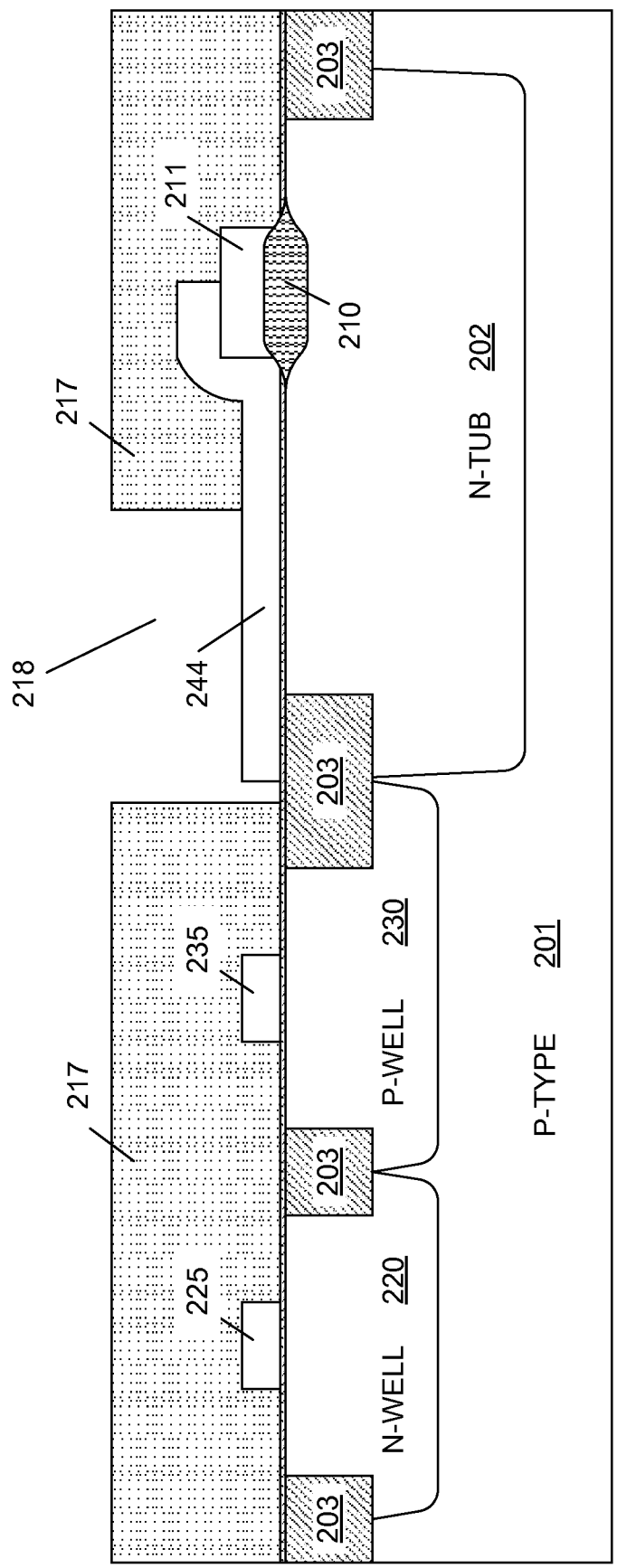

As illustrated in FIG. 3K, gate line photoresist mask 216 is removed, and a second gate line photoresist mask 217 is formed over the resulting structure. The second gate line mask 217 includes an opening 218, which exposes a portion of polysilicon region 244 on the source side of LDMOS transistor 200.

Figure 3L:
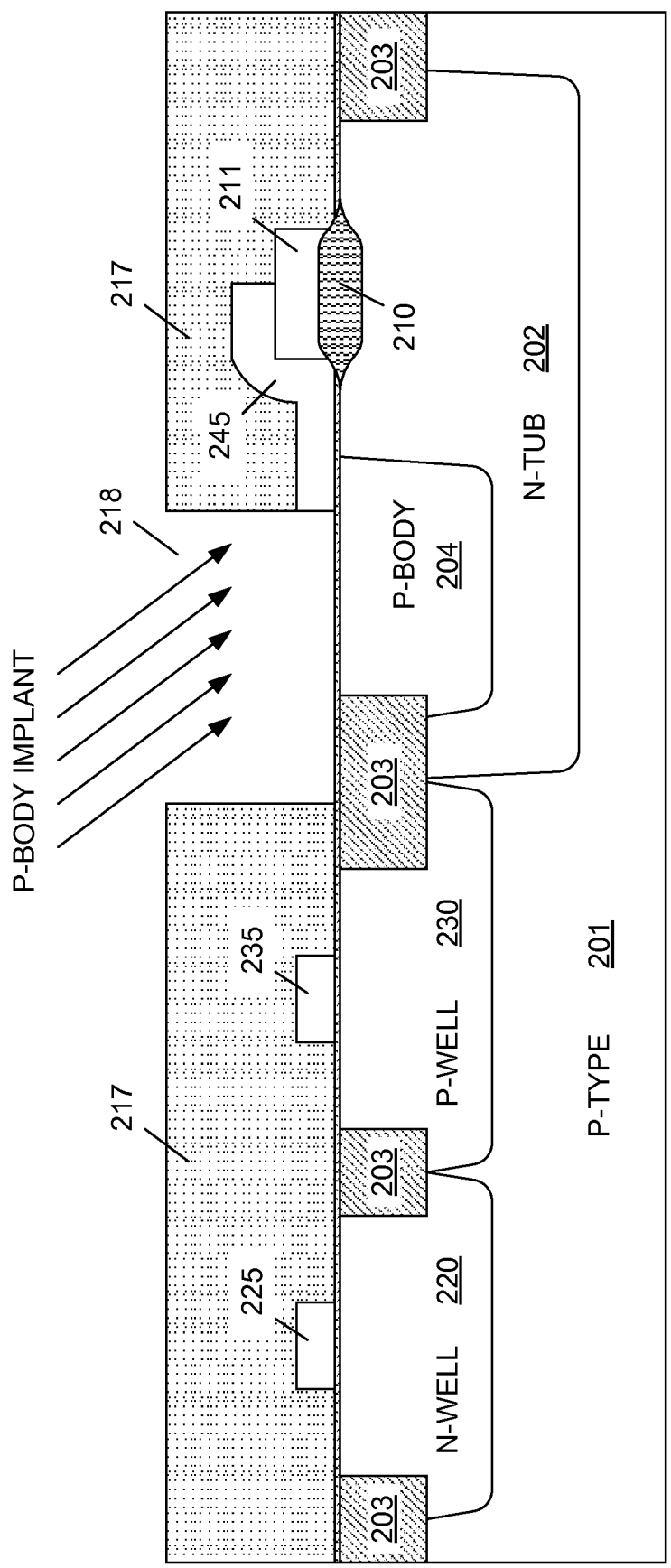

As shown in FIG. 3L, an etch is performed through opening 218 of the second gate line photoresist mask 217, thereby removing the exposed portions of polysilicon region 244. The remaining portion of etched polysilicon region 244 forms the gate electrode 245 of LDMOS transistor 200.

A p-type body implant is then performed at an angle through opening 218, thereby forming p-body region 204. The p-type body implant is self-aligned to the second gate line photoresist mask 217. The p-type body implant is described in more detail in commonly owned U.S. patent application Ser. No. 11/691,459-5691, which is hereby incorporated by reference. The second gate line mask 217 is then stripped, and conventional CMOS front-end and back-end processes are used to create the structure of FIG. 2.

More specifically, source/drain extension implants are performed to create lightly doped source/drain extension regions 223-224, 233-234 and 243 in low voltage PMOS transistor 250, low voltage NMOS transistor 260 and LDMOS transistor 200. Dielectric sidewall spacers 247 are then formed adjacent to the gate electrodes 225, 235 and 245. A P+ implant is performed to create source/drain contact regions 221-222 and p-body contact region 240. An N+ implant is performed to create source/drain contact regions 231-232 and 241-242. The exposed portions of gate oxide regions 212-214 are then removed, and metal salicide regions 248 are formed over the resulting structure using a conventional salicide process. A standard CMOS process is used to form the remaining back-end structures (e.g., contacts, metals and vias), which are not shown for the sake of clarity.

Table 1 below compares the threshold voltage ($V_{TH}$), drain saturation current ($I_{DSAT}$), on-resistance ($R_{DSON}$), breakdown voltage ($BV_{DSS}$) and hot carrier lifetime of a conventional LDMOS transistor with LDMOS transistor processed in accordance with the steps described in FIGS. 3A-3L above. In the bump isolated LDMOS transistor, the gate insulating layers 210 and 211 have a combined thickness of 1500 Angstroms. Note that Vd and Vg represent the voltages applied to drain contact region 242 and gate electrode 245, respectively.

TABLE 1

| Parameter | Conventional LDMOS | Bump isolation LDMOS | Comment |
|---|---|---|---|
| $V_{TH}$ | 0.87 Volt | 0.90 Volt | Vd = 0.1 V Gm max |
| $I_{DSAT}$ | 317 µA/µm | 480 µA/µm | Vg = 5 V Vd = 25 V |
| $R_{DSON}$ | 31.32 mΩ * mm² | 21.3 mΩ * mm² | Vg = 5 V Vd = 0.1 V |
| $BV_{DSS}$ | 32 Volt | 32 Volt | Id = 0.1uA Vg = 0 V |
| HCI lifetime | 5.0e−4 yrs | 1.1 yrs | 10% Rdson @worst case |

The LDMOS transistors of the present invention exhibit substantially the same threshold voltage as the conventional LDMOS transistor. The LDMOS transistors of the present invention exhibit significantly lower on-resistances than the conventional LDMOS transistor, which leads to higher drain current flow. The lower on-resistance is achieved because the thin oxide layer 210 does not extend into the substrate as deeply as the field oxide region 109 of conventional LDMOS transistor 100 (or the STI region 129 of conventional LDMOS transistor 120). Finally, the hot carrier degradation is more than 3 orders of magnitude better in the LDMOS transistors of the present invitation.

Figure 4:
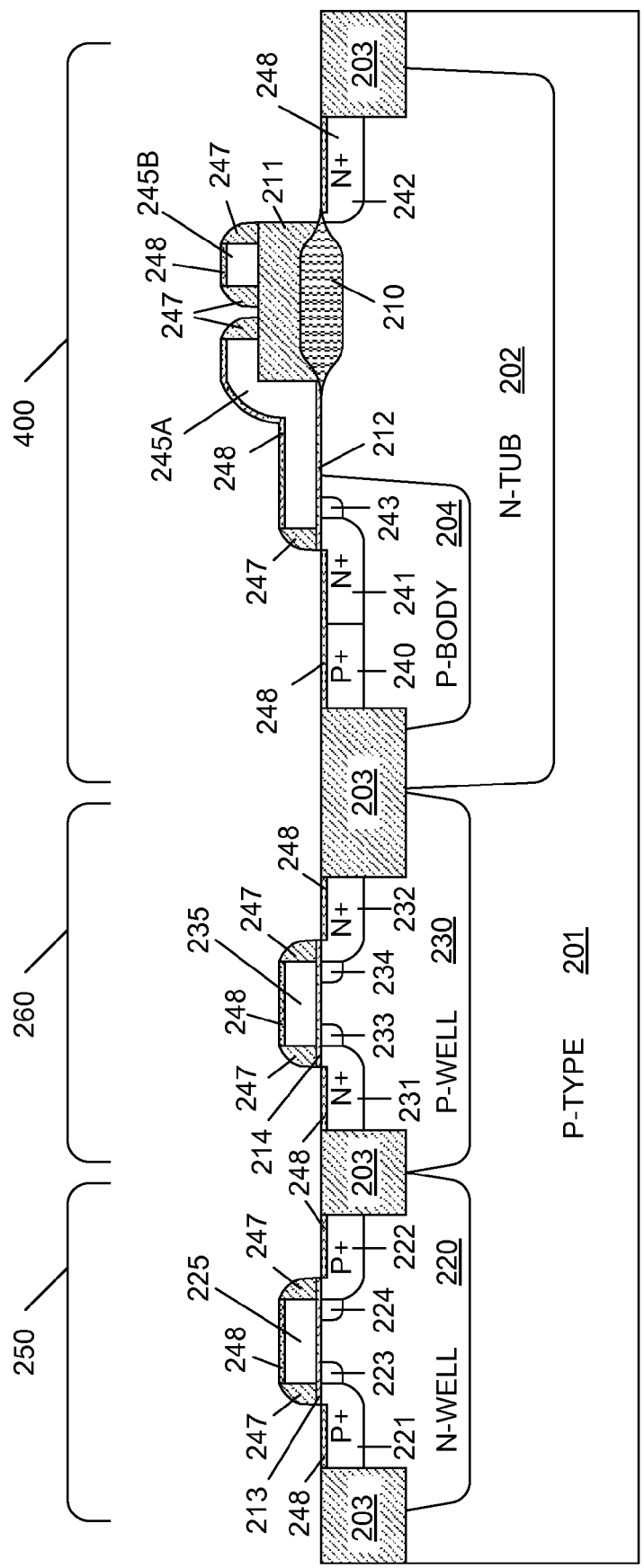
FIG. 4 is a cross sectional view of a split gate LDMOS transistor in accordance with one variation of the present invention.

FIG. 4 is a cross-sectional view of a split gate LDMOS transistor 400 in accordance with one variation of the present invention. Because LDMOS transistor 400 is similar to LDMOS transistor 200, similar elements in FIGS. 2 and 4 are labeled with similar reference numbers. As shown in FIG. 4, LDMOS transistor 400 replaces the continuous gate electrode 245 of LDMOS transistor 200 with a split gate electrode that includes gate electrode 245A and field control electrode 245B. Gate electrodes 245A and 245B can be formed, for example, by modifying gate line mask 216 (FIG. 3J). The voltage applied to field control electrode 245B is selected (largely independent of the voltage applied to gate electrode 245A) to control the electric field that exists under shallow field isolation region 210. The application of different voltages to field control electrode 245B and gate electrode 245A can be referred to as a field plating technique. This field plating technique can be used to improve the Rdson/BVdss ratio exhibited by the associated LDMOS transistor.

Figure 1A:
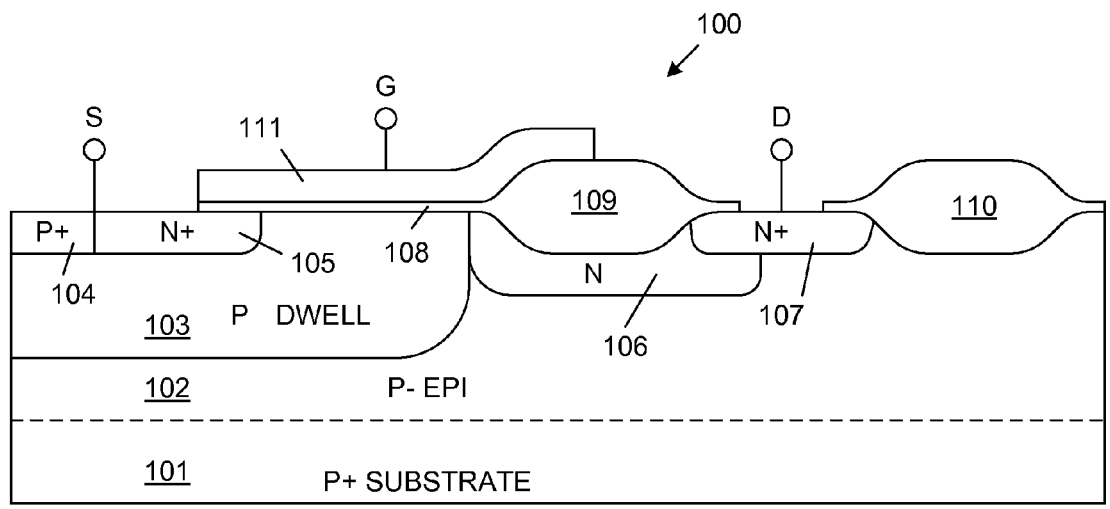
FIGS. 1A and 1B are cross-sectional views of conventional LDMOS transistors.
Figure 1B:
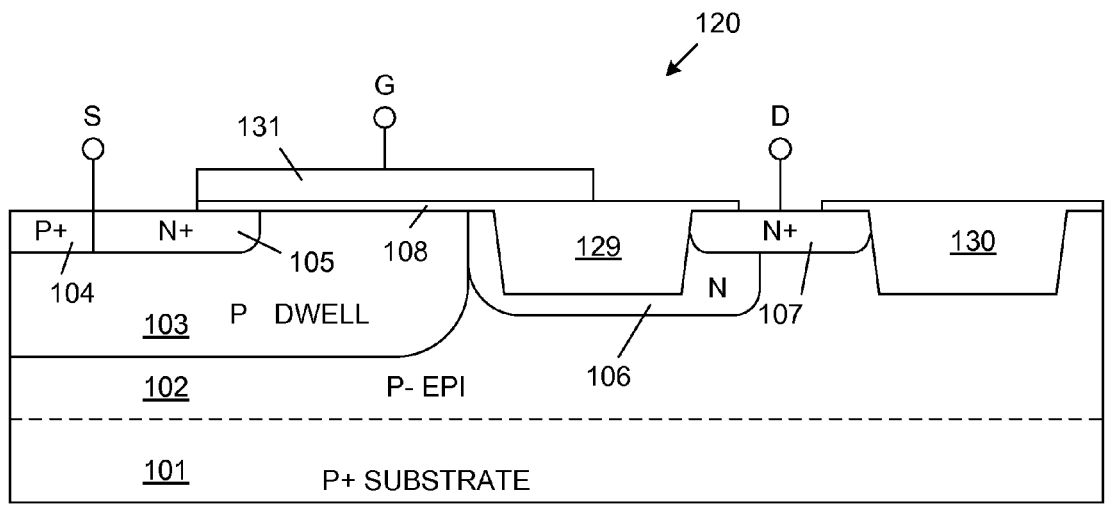

Although field plating techniques have been used in the past, it is important to note that the field plating technique of the present invention will provide improved Rdson/BVdss ratios when compared with conventional field plating techniques. This is because conventional field plating techniques have been applied to conventional LDMOS transistors, which are formed using the relatively thick conventional dielectric layers available in the CMOS platform (see, e.g., LOCOS region 109 of FIG. 1). As a result, a relatively high voltage must be applied to adjust the field under the relatively thick dielectric layer in order to obtain any improvement in the Rdson/BVdss ratio. However, the LDMOS transistor of the present invention allows for optimization of the thickness of the dielectric bump created by the combination of dielectric layers 210 and 211. By optimizing the thickness of the dielectric bump, the Rdson/BVdss ratio can advantageously be minimized.

FIGS. 5A-5E are cross sectional views of an LDMOS transistor, a low voltage PMOS transistor and a low voltage NMOS transistor during various stages of fabrication, in accordance with an alternate embodiment of the present invention. Because the process of this alternate embodiment is similar to the method of FIGS. 3A-3L, similar elements in FIGS. 5A-5E and 3A-3L are labeled with similar reference numbers. In general, the process of the alternate embodiment eliminates the stacked dielectric region 211 and subsequent CMP, thereby simplifying the resulting process. In this alternate embodiment, processing starts with the structure illustrated by the cross sectional view of FIG. 3E. However, the shallow field oxide region 210 is thermally grown to be thicker in this alternate embodiment, to compensate for the fact that the stacked dielectric region 211 is not included. For example, in this alternate embodiment, shallow field oxide region 210 may be thermally grown to a thickness of about 1500 Angstroms.

Although the shallow field oxide region 210 is thicker in the alternate embodiment, the shallow field oxide region 210 is still substantially thinner than STI regions 203. In accordance with one embodiment, the thickness of shallow field oxide region 210 is at least about half the thickness of STI regions 203. This allows shallow field oxide region 210 to provide adequate isolation, while still reducing the on-resistance of the resulting LDMOS transistor (compared with conventional LDMOS transistors 100 and 120).

As illustrated in FIG. 5A, silicon oxide layer 205 and silicon nitride layer 206 are removed, leaving shallow field oxide region 210.

As illustrated in FIG. 5B, gate dielectric layers 212-214 and polysilicon layer 215 are formed over the resulting structure.

Figure 5C:
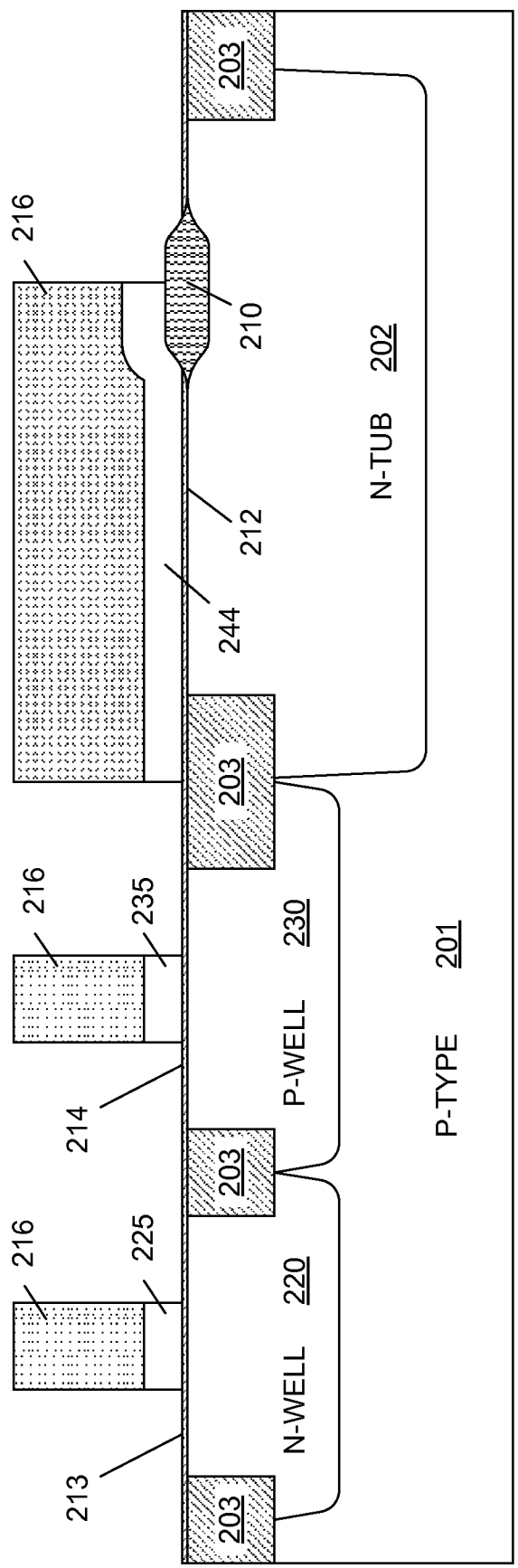

As illustrated in FIG. 5C, a first gate line photoresist mask 215 is formed over polysilicon layer 215, and an etch is performed, leaving polysilicon gates 225 and 235, and polysilicon region 244.

Figure 5D:
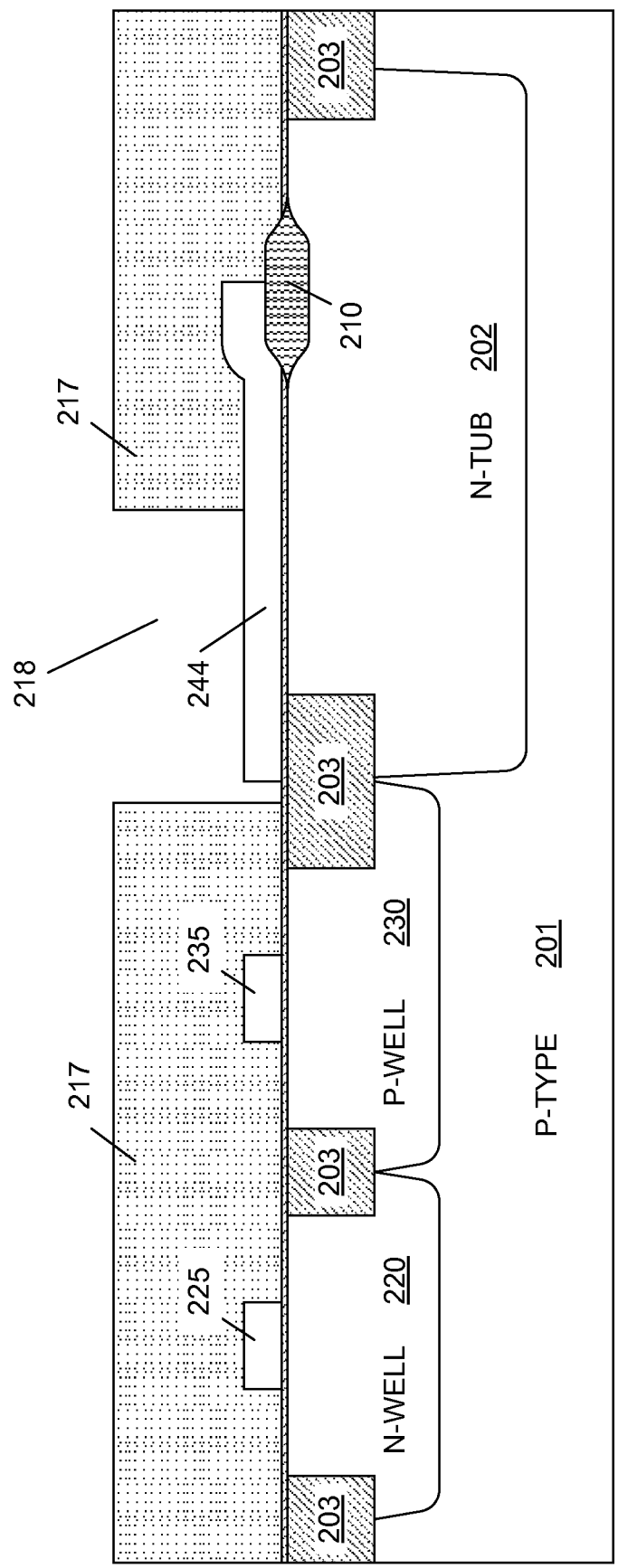

As illustrated in FIG. 5D, gate line photoresist mask 216 is removed, and a second gate line photoresist mask 217 is formed over the resulting structure. The second gate line mask 217 includes an opening 218, which exposes a portion of polysilicon region 244 on the source side of the LDMOS transistor structure.

Figure 5E:
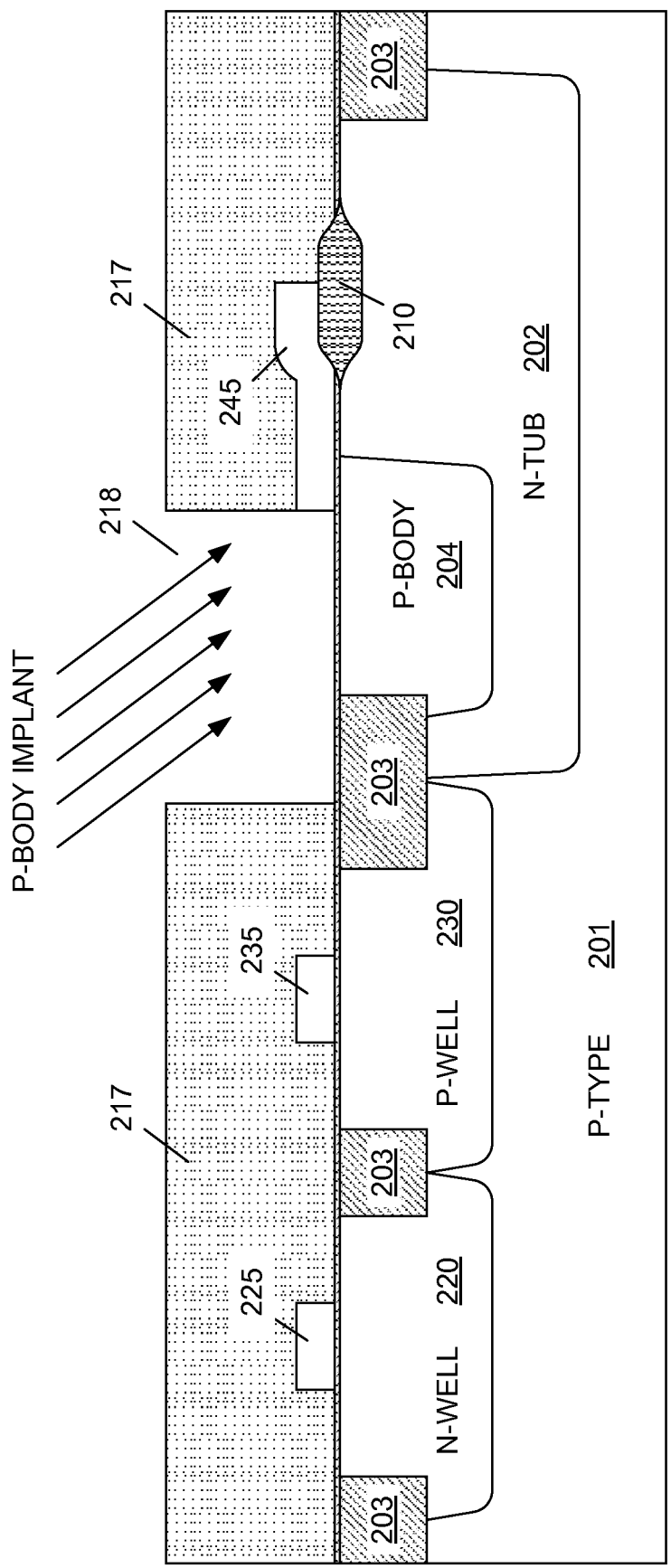

As shown in FIG. 5E, an etch is performed through opening 218 of the second gate line photoresist mask 217, thereby removing the exposed portions of polysilicon region 244. The remaining portion of etched polysilicon region 244 forms the gate electrode 245 of the resulting LDMOS transistor.

A p-type body implant is then performed at an angle through opening 218, thereby forming p-body region 204. The second gate line mask 217 is then stripped, and conventional CMOS front-end and back-end processes are used to create the structure of FIG. 6.

Figure 6:
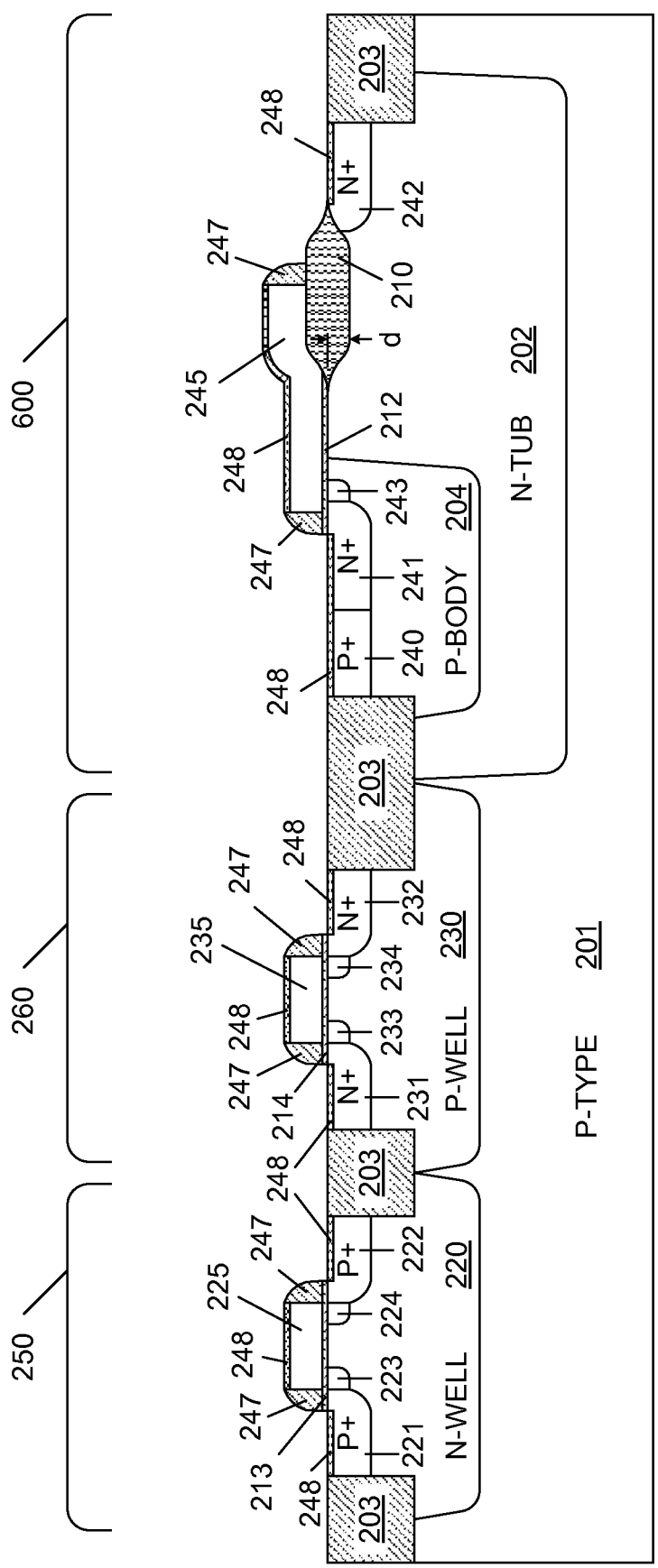
FIG. 6 is a cross-sectional view of an LDMOS transistor fabricated in accordance with the alternate embodiment of the present invention illustrated by FIGS. 5A-5E.

FIG. 6 is a cross-sectional view of an LDMOS transistor 600 fabricated in accordance with the alternate embodiment of the present invention illustrated by FIGS. 5A-5E. Note that FIG. 6 also includes cross-sectional views of low voltage MOS transistors 250 and 260. Because LDMOS transistor 600 is similar to LDMOS transistor 200 (FIG. 2), similar elements in FIGS. 6 and 2 are labeled with similar reference numbers.

Figure 7:
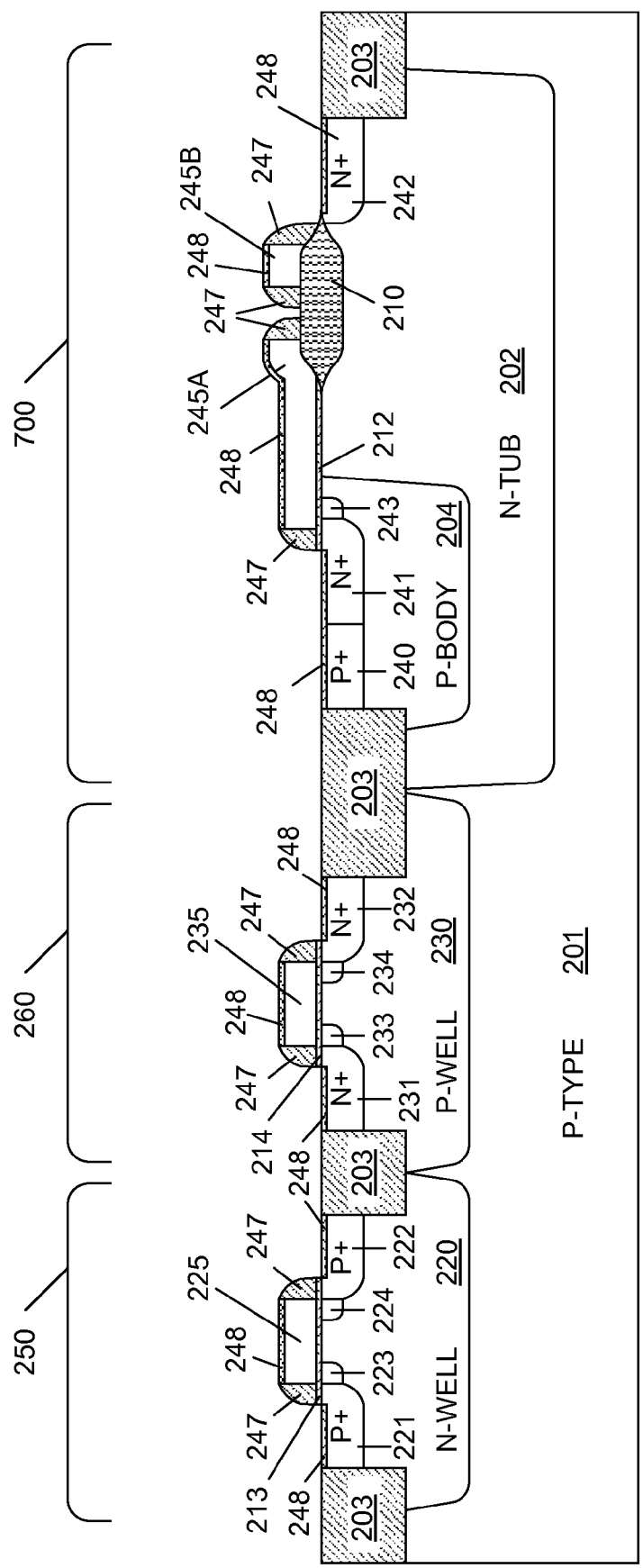
FIG. 7 is a cross sectional view of a split gate LDMOS transistor fabricated in accordance with one variation of the embodiment illustrated by FIGS. 5A-5E.

FIG. 7 is a cross sectional view of a split gate LDMOS transistor 700 fabricated in accordance with one variation of the embodiment illustrated by FIGS. 5A-5E. Because LDMOS transistor 700 is similar to LDMOS transistors 400 and 600, similar elements in FIGS. 4, 6 and 7 are labeled with similar reference numbers. As shown in FIG. 7, LDMOS transistor 700 replaces the continuous gate electrode 245 of LDMOS transistor 600 with a split gate electrode that includes gate electrode 245A and field control electrode 245B. LDMOS transistor 700 may be operated in a manner similar to LDMOS transistor 400.

Although the invention has been described in connection with several embodiments, it is understood that this invention is not limited to the embodiments disclosed, but is capable of various modifications, which would be apparent to a person skilled in the art. For example, the conductivity types of the various semiconductor regions can be reversed with similar results. Thus, the invention is limited only by the following claims.

We claim:

1. A semiconductor structure comprising:
  a semiconductor substrate;
  a plurality of shallow trench isolation (STI) regions, each extending at least a first depth below an upper surface of the semiconductor substrate, wherein the STI regions electrically isolate devices fabricated in the semiconductor substrate, and wherein the STI regions do not exhibit a bird's beak profile; and
  a transistor comprising:
    a drain diffusion region located in the semiconductor substrate;
    a gate dielectric layer located over a first portion of the drain diffusion region;
    a thermal oxide layer having a bird's beak profile located over a second portion of the drain diffusion region and extending a second depth below the upper surface of the semiconductor substrate, wherein the first depth is greater than the second depth; and
    a first gate electrode that extends over the gate dielectric layer and the thermal oxide layer.

2. The semiconductor structure of claim 1, wherein the first depth is at least ten times larger than the second depth.

3. The semiconductor structure of claim 1, wherein the gate dielectric layer has a thickness that is less than the second depth.

4. The semiconductor structure of claim 1, wherein the transistor further comprises a second gate electrode, separate from the first gate electrode, which extends over the thermal oxide layer.

5. The semiconductor structure of claim 1, wherein the transistor further comprises a stacked dielectric region located entirely over the thermal oxide layer, wherein the first gate electrode extends over the stacked dielectric region.

6. The semiconductor structure of claim 5, wherein the transistor further comprises a second gate electrode, separate from the first gate electrode, which extends over the thermal oxide layer.

7. The semiconductor structure of claim 1, wherein the second depth is about 250 Angstroms or less.

8. A semiconductor transistor structure comprising:
  a drain diffusion region having a first conductivity type and an upper surface;
  a thermal oxide layer located on a first portion of the drain diffusion region, wherein the thermal oxide layer includes a lower portion that extends a first depth below the upper surface of the drain diffusion region;
  a stacked dielectric region located entirely on the thermal oxide layer;
  a first gate electrode that extends over the stacked dielectric region; and
  a gate dielectric region located on the upper surface of the drain diffusion region, wherein the gate dielectric region is thinner than the stacked dielectric region.

9. The semiconductor transistor structure of claim 8, wherein the first gate electrode also extends over the gate dielectric region.

10. The semiconductor transistor structure of claim 8, wherein a second gate electrode, separate from the first gate electrode, extends over the stacked dielectric region.

11. The semiconductor transistor structure of claim 8, further including a field isolation structure configured to isolate the transistor structure, wherein the field isolation structure extends a second depth below the upper surface of the drain diffusion.

12. The semiconductor transistor structure of claim 11, wherein the second depth is at least 10 times greater than the first depth.

13. The semiconductor transistor structure of claim 11, wherein the first depth is about 250 Angstroms or less.

14. The semiconductor transistor structure of claim 8, wherein the first depth is about 250 Angstroms or less.

15. The semiconductor transistor structure of claim 8, further comprising a diffusion body region located in the drain diffusion region and forming a channel region of the semiconductor transistor structure, wherein the diffusion body region has a second conductivity type, opposite the first conductivity type.

16. The semiconductor transistor structure of claim 15, wherein a portion of the diffusion body region extends under the first gate electrode.

17. A semiconductor transistor structure comprising:
  a drain diffusion region having a first conductivity type and an upper surface;
  a thermal oxide layer located on a first portion of the drain diffusion region, wherein the thermal oxide layer includes a lower portion that extends a first depth below the upper surface of the drain diffusion region;
  a stacked dielectric region located entirely on the thermal oxide layer, wherein the stacked dielectric region has a thickness greater than a thickness of the thermal oxide layer; and
  a first gate electrode that extends over the stacked dielectric region.

* * * * *